United States Patent
Priebe

[19]

[11] Patent Number: 5,825,212
[45] Date of Patent: Oct. 20, 1998

[54] HIGH SPEED SINGLE ENDED BIT LINE SENSE AMPLIFIER

[75] Inventor: Gordon W. Priebe, Champlin, Minn.

[73] Assignee: LSI Logic Corporation, Milpitas, Calif.

[21] Appl. No.: 698,343

[22] Filed: Aug. 15, 1996

[51] Int. Cl.⁶ .................................................. G01C 7/06
[52] U.S. Cl. .............................................. 327/52; 327/51
[58] Field of Search ................................. 327/51, 52, 56, 327/57, 65, 77, 89, 333

[56] References Cited

U.S. PATENT DOCUMENTS

| | | | |
|---|---|---|---|
| 4,973,864 | 11/1990 | Nogami | 327/52 |
| 5,012,450 | 4/1991 | Mattausch et al. | 327/52 |
| 5,293,088 | 3/1994 | Kasa | 327/51 |
| 5,644,258 | 7/1997 | Wu | 327/52 |

OTHER PUBLICATIONS

Sedra et al., "Microelectronic Circuits," CBS College Publishing, 2nd edition, pp. 362–363, 1987.

*Primary Examiner*—Toan Tran
*Attorney, Agent, or Firm*—Westman, Champlin & Kelley, P.A.

[57] ABSTRACT

A single ended bit line sensor includes a single ended bit line input, a sensor output, an inverting amplifier, a non-inverting amplifier and a differential amplifier. The inverting amplifier is coupled to the single ended bit line input and has a first voltage output. The noninverting amplifier is coupled to the single ended bit line input and has a second voltage output. The differential amplifier has first and second amplifier inputs coupled to the first and second voltage outputs, respectively, and has an amplifier output coupled to the sensor output.

11 Claims, 3 Drawing Sheets

1

HIGH SPEED SINGLE ENDED BIT LINE SENSE AMPLIFIER

BACKGROUND OF THE INVENTION

The present invention relates to semiconductor memory devices and, in particular, to a single ended bit line sense amplifier.

A semiconductor memory device has a plurality of output "bit lines", with each line having a logic state that is indicative of the data being read from the memory device. The output bit lines are either single ended or differential. A single ended bit line is typically precharged high or low (most often high). During a read operation, the precharge on the bit line is removed and the bit line will then either stay high or fall low, depending upon the data on the bit line.

A sense amplifier senses the logic state on the bit line. A traditional sense amplifier includes an inverter coupled in series with the bit line. A typical CMOS inverter includes an N-channel and a P-channel transistor. The length and width of the N-channel and P-channel transistors have a ratio which is selected to provide a switch point that is relatively independent of variations in process, voltage and temperature (PVT). However, the inverter is slow when the slew rate of the bit line is slow. The threshold voltage of the P-channel transistor creates a very long delay between a drop in the bit line voltage and a corresponding rise in the output voltage of the inverter.

There is a continuing need for improved single ended bit line sense amplifiers having a high speed and being relatively independent of a P-channel threshold voltage.

SUMMARY OF THE INVENTION

The single ended bit line sense amplifier of the present invention includes a single ended bit line input, a sensor output, an inverting amplifier, a non-inverting amplifier and a differential amplifier. The inverting amplifier is coupled to the single ended bit line input and has a first voltage output. The non-inverting amplifier is coupled to the single ended bit line input and has a second voltage output. The differential amplifier has first and second amplifier inputs coupled to the first and second voltage outputs, respectively, and has an amplifier output coupled to the sensor output.

In a preferred embodiment of the present invention, the inverting amplifier includes a first current source and a pull-down MOSFET. The first current source is coupled between a first supply terminal and the first voltage output. The pull-down MOSFET has gate coupled to the single ended bit line input and has a drain and a source coupled between the first voltage output and a second supply terminal. The non-inverting amplifier includes a second current source and a pull-up MOSFET. The second current source is coupled between the second voltage output and the second supply terminal. The pull-up MOSFET has a gate coupled to the single ended bit line and has a drain and source coupled between the first supply terminal and the second voltage output.

The single ended bit line input is preferably precharged to a logic high state and then switched to a non-precharged state when the data on the input is to be sensed. In the precharged state, the first and second current sources are disabled. The pull-down MOSFET pulls the first voltage output low while the pull-up MOSFET pulls the second voltage output high. The differential amplifier senses the polarity of the first and second voltage outputs and generates an output indicative of the precharged high state on the single ended bit line input.

In the non-precharged state, the first and second current sources are enabled. If the data on the single ended bit line input is high, the pull-down and pull-up MOSFETs remain on and divide the voltage on the first and second voltage outputs with the first and second current sources. The voltage levels at the first and second voltage outputs shift to analog differential voltage levels, the polarity of which is sensed by the differential amplifier. If the data on the single ended bit line input drops from a logic high level toward a logic low level, the pull-down and pull-up MOSFETs begin to turn off, allowing the first current source to pull the first voltage output high and the second current source to pull the second voltage output low, which causes a change in polarity between the first and second voltage outputs. Since the first and second voltage outputs have been level-shifted to differential voltage levels, the change in differential voltage is sensed quicker than a change in digital logic levels. The single ended bit line sense amplifier of the present invention provides fast, single ended sense capability. The sense amplifier also has robust operation over all process, voltage and temperature variations and can be used in low voltage applications.

DETAILED DESCRIPTION OF THE PREFERRED EMBODIMENTS

Figure 1:
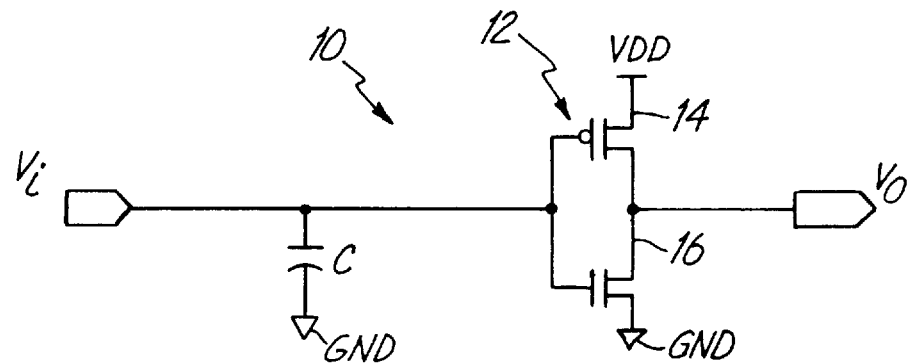
FIG. 1 is a schematic diagram of a sense amplifier of the prior art.
Figure 2:
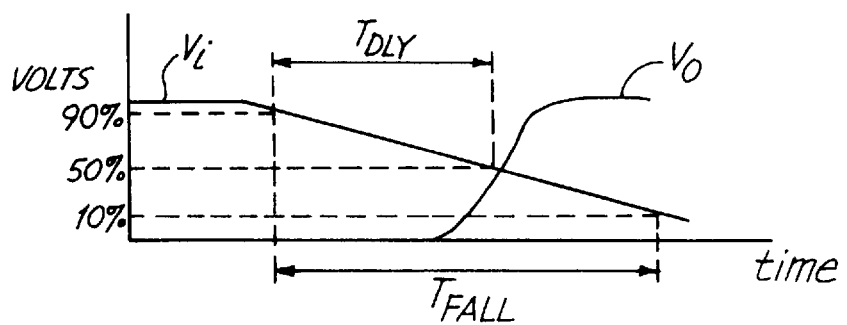
FIG. 2 is a graph of the voltage characteristics of the sense amplifier shown in FIG. 1.

FIG. 1 is a schematic diagram of a traditional sense amplifier 10 of the prior art. Sense amplifier 10 includes a single ended memory bit line input $V_I$, a capacitor C, a CMOS inverter 12 and an output $V_O$. CMOS inverter 12 includes P-channel and N-channel transistors 14 and 16 which drive output $V_O$ high or low as a function of the logic state of input $V_I$. A typical memory bit line has a long slew rate as the data transitions from a logic high state to a logic low state, as shown in FIG. 2. As the voltage on input $V_I$ drops, N-channel transistor 16 turns off and P-channel transistor 14 turns on to pull the voltage on output $V_O$ high. The threshold voltage of P-channel transistor 14 causes a very long delay $T_{DLY}$ from the time at which the input voltage $V_I$ begins to drop to the time at which the P-channel transistor 14 turns on and raises the output voltage $V_O$ to 50% of its full value. As a result, sense amplifier 10 is very slow when the memory bit line slew rate is slow.

Figure 3:
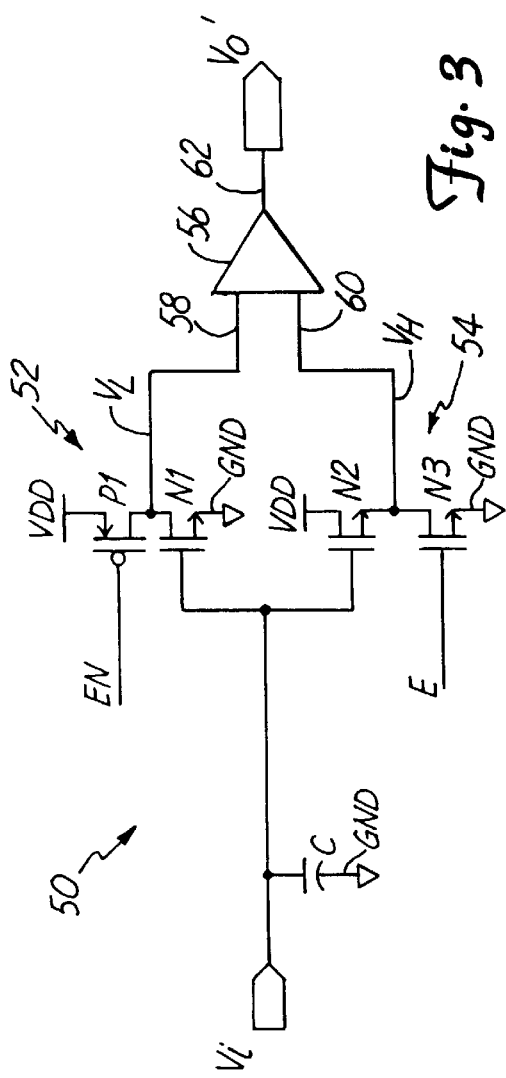
FIG. 3 is a schematic diagram of a single ended bit line sense amplifier of the present invention.

FIG. 3 is a schematic diagram of a single ended bit line sense amplifier 50 according to the present invention. Sense amplifier 50 includes a single ended memory bit line input $V_I$, a capacitor C, complementary enable inputs E and EN, an inverting amplifier 52, a noninverting amplifier 54, a differential amplifier 56 and a sensor output $V_O'$. Capacitor C is coupled between bit line input $V_I$ and supply terminal GND. Inverting amplifier 52 includes a P-channel metal oxide semiconductor field effect transistor (MOSFET) P1 and an N-channel MOSFET N1. P-channel MOSFET P1 has a gate coupled to enable input EN, a source coupled to supply terminal VDD and a drain coupled to voltage output node $V_L$. P-channel MOSFET P1 operates as a selectable current source for voltage output node $V_L$, which is enabled by enable input EN. N-channel MOSFET N1 has a gate coupled to bit line input $V_I$, a drain coupled to voltage output node $V_L$ and a source coupled to supply terminal GND. N-channel MOSFET N1 operates as a pull-down device which pulls voltage output node $V_L$ low toward supply terminal GND as a function of the logic state on bit line input $V_I$.

Noninverting amplifier 54 includes N-channel MOSFET N2 and N-channel MOSFET N3. N-channel MOSFET N2 has a gate coupled to bit line input $V_I$, a drain coupled to supply terminal VDD and a source coupled to voltage output node $V_H$. N-channel MOSFET N2 operates as a pull-up device which pulls voltage output node $V_H$ high toward VDD as a function of the logic state of bit line input $V_I$. N-channel transistor N3 has a gate coupled to enable input E, a drain coupled to voltage output node $V_H$ and a source coupled to supply terminal GND. N-channel MOSFET N3 operates as a selectable current source for voltage output node $V_H$, which is enabled by enable input E.

Differential amplifier 56 includes amplifier inputs 58 and 60 which are coupled to voltage output nodes $V_L$ and $V_H$, respectively. Differential amplifier 56 has an output 62 which is coupled to sensor output $V_O'$.

Figure 4:
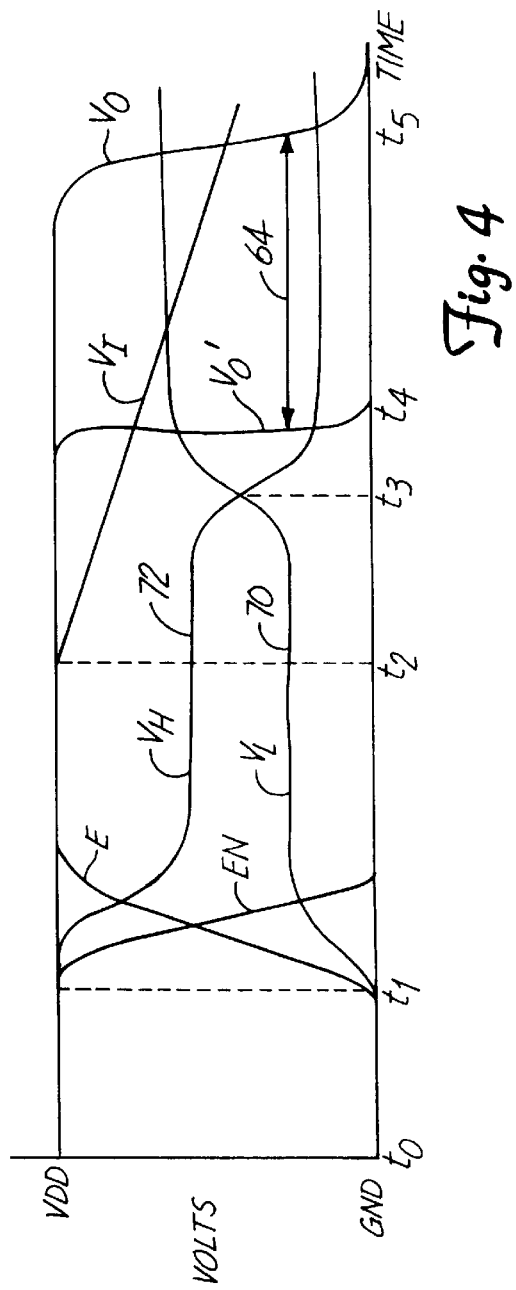
FIG. 4 is a graph comparing the voltage characteristics of the sense amplifiers shown in FIGS. 1 and 3.

FIG. 4 is a graph which illustrates the voltage characteristics of various nodes in sense amplifier 50 over time, as compared to sense amplifier 10 (shown in FIG. 1). At time $t_0$, bit line input $V_I$ is initially precharged to a logic high level. Enable input E is initially low and enable input EN is initially high. P-channel MOSFET P1 and N-channel MOSFET N3 are off and N-channel MOSFETs N1 and N2 are on. N-channel MOSFET N1 pulls voltage output node $V_L$ low and N-channel MOSFET N2 pulls voltage output node $V_H$ high. Therefore, $V_L<V_H$. Differential amplifier 56 senses the relative polarity of $V_L$ and $V_H$, and drives sensor output $V_O'$ to a logic high level, indicating the logic state of bit line input $V_I$ during the precharge state.

At time $t_1$, the precharge on bit line $V_I$ is removed and enable inputs E and EN change state. P-channel MOSFET P1 and N-channel MOSFET N3 turn on and supply current to voltage output nodes $V_L$ and $V_H$, respectively. If bit line input $V_I$ stays high, indicating that the data is high, N-channel MOSFETs N1 and N2 stay on and therefore divide the voltages at voltage output nodes $V_L$ and $V_H$ with MOSFETs P1 and P2. The voltage at node $V_L$ increases to level 70 as shown in FIG. 4, and the voltage at node $V_H$ decreases to level 72. However, the voltages at nodes $V_L$ and $V_H$ maintain the same relative polarity with $V_L<V_H$. In one embodiment, the voltages on nodes $V_L$ and $V_H$ are shifted to analog differential levels for sensing by differential amplifier 56. Differential amplifier 56 senses the relative polarity of $V_L$ and $V_H$ and drives sensor output $V_O'$ high as in the precharged state.

At time $t_2$, bit line input $V_I$ drops, indicating that the data is low. As $V_I$ drops, N-channel MOSFETs N1 and N2 turn off. Since P-channel MOSFET P1 and N-channel MOSFET N3 are still on, the voltage on node $V_L$ increases and the voltage on node $V_H$ decreases. At time $t_3$, the polarity of nodes $V_L$ and $V_H$ switches such that $V_L>V_H$. Differential amplifier 56 senses the change in polarity and drives sensor output $V_O'$ low at time $t_4$. The change in polarity of nodes $V_L$ and $V_H$ is sensed very quickly since the voltages at nodes $V_L$ and $V_H$ have been level shifted. Differential amplifier 56 does not have to wait for a full logic level change. Rather, differential amplifier 56 has to wait only for a change in polarity of a relatively low differential voltage across nodes $V_L$ and $V_H$.

The output voltage on output $V_O$ of sense amplifier 10 shown in FIG. 1 has been inverted and superimposed on FIG. 4 for comparison. The output $V_O$ drops at a much later time, $t_5$, than the output $V_O'$ of the present invention. The difference in time, $t_5-t_4$, shown by arrow 64 represents the relative increase in sensing speed between sense amplifier 50 of the invention and sense amplifier 10 shown in FIG. 1. Also, sense amplifier 50 does not rely directly on the threshold voltage of P-channel MOSFET P1 to produce the differential voltage at nodes $V_L$ and $V_H$ when those nodes are at the common-mode sensing range of differential amplifier 56.

Figure 5:
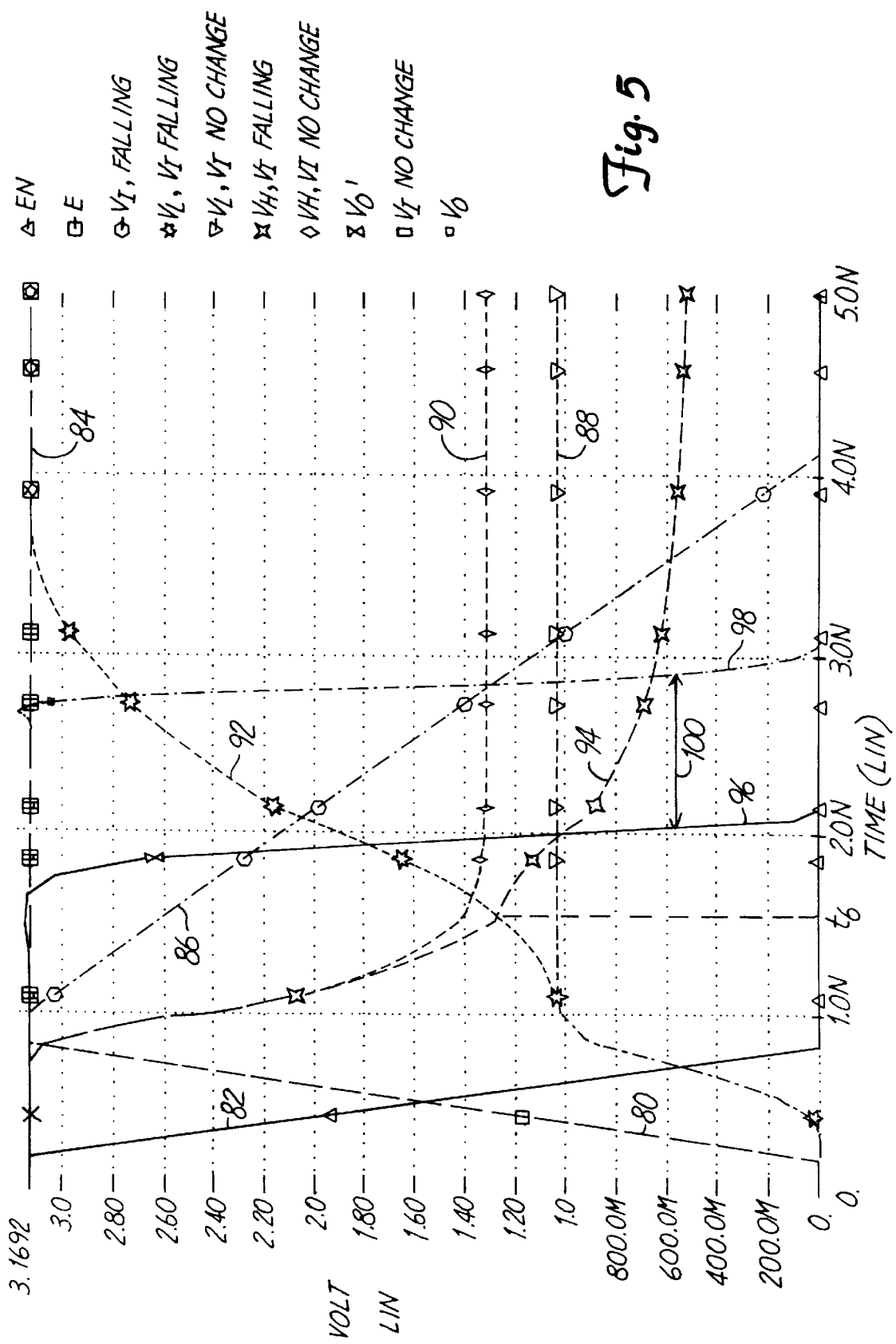
FIG. 5 is a graph of the voltage characteristics of the sense amplifiers shown in FIGS. 1 and 3 over various operating conditions.

FIG. 5 is a more detailed graph which illustrates a comparison of SPICE simulation results of the sense amplifiers shown in FIGS. 1 and 3 over various operating conditions, where VDD equals 3.13 volts. The waveforms generated at the various operating nodes have been superimposed on one another. Waveform 80 represents enable input E and waveform 82 represents enable input EN, which become active at approximately 0.75 nanoseconds. Waveform 84 represents the voltage on bit line input $V_I$ when the voltage remains high after the precharge has been removed. Waveform 86 represents the voltage on bit line input $V_I$ when the voltage begins falling at approximately t=1.0 nanoseconds, after the precharge has been removed.

Once the precharge has been removed, and if there is no change in the voltage on bit line input $V_I$, as shown by waveform 84, the voltage on node $V_L$ rises from zero to about 1.05 volts, as shown by waveform 88. The voltage on node $V_H$ falls from 3.1 volts to about 1.3 volts, as shown by waveform 90. The voltages on nodes $V_L$ and $V_H$ have therefore shifted, but maintain the same relative polarity. This is, in effect, a preswitch level shift.

When the voltage on bit line input $V_I$ falls, as shown by waveform 86, the voltage on node $V_L$ rises, as shown by waveform 92. The voltage on node $V_H$ falls, as shown by waveform 94. The polarity of the differential voltage across nodes $V_L$ and $V_H$ switches at time $t_6$. In response to the change in polarity, the differential amplifier 56 the voltage on output $V_O'$ low, as shown by waveform 96.

Waveform 98 represents the voltage on output $V_O$ of sense amplifier 10 shown in FIG. 1, which has been inverted for comparison. Arrow 100 represents the decrease in delay on the output of the sense amplifier of the present invention as compared to the output of the sense amplifier shown in FIG. 1 in response to a change in state of the bit line input $V_I$. In the simulation shown in FIG. 5, the delay decreased by 1 nanosecond over a cycle time of 5 nanoseconds.

The sense amplifier of the present invention therefore significantly speeds the sense timing for single ended sense applications. The sense amplifier of the present invention does not rely directly on a P-channel threshold voltage to produce a differential voltage, in a common mode sensing range. The sense amplifier of the present invention therefore provides fast, single ended sense capability with robust operation over all process, voltage and temperature variations. Since there is no direct dependence on a P-channel threshold voltage, the sense amplifier of the present invention is particularly useful for low voltage applications such as applications with supply voltages of less than two volts.

Various modifications can be made to the sense amplifier of the present invention. For example, enable inputs E and EN can include a pair of complementary enable signals or can include a single enable signal, depending upon the particular circuit configuration of the current sources. Each current sources can have a variety of configurations, such as a resistor, a P-channel MOSFET, an N-channel MOSFET or a network of P-channel or N-channel MOSFETs. The pull-down and pull-up devices within inverting amplifier 52 and noninverting amplifier 54 can also have a variety of configurations. In addition, a variety of differential amplifiers can be used with the present invention.

Although the present invention has been described with reference to preferred embodiments, workers skilled in the art will recognize that changes may be made in form and detail without departing from the spirit and scope of the invention. For example, the sense amplifier of the present invention can be implemented with various technologies other than MOS technology. The voltage supply terminals can be relatively positive or relatively negative, depending upon the particular convention adopted and the technology used. The terms "pull-up" and "pull-down" used in the specification and the claims are arbitrary terms and can refer to either a logic high level or a logic low level, depending upon the relative levels of the voltage supply terminals. Likewise, the term "coupled" can include various types of connections or couplings and can include a direction connection or a connection through one or more intermediate components.

What is claimed is:

1. A single-ended bit line sensor comprising:

a single-ended bit line input;

a sensor output;

a differential amplifier having first and second amplifier inputs and having an amplifier output coupled to the sensor outputs;

a first current source coupled between a first supply terminal and the first amplifier input; and a pull-down device coupled between the first amplifier input and a second supply terminal and having a control input coupled to the single-ended bit line input;

a second current source coupled between the second amplifier input and the second supply terminal; and a pull-up device coupled between the first supply terminal and the second amplifier input and having a control input coupled to the single-ended bit line input.

2. The single-ended bit line sensor of claim 1 and further comprising:

an enable input; and wherein the first and second current sources each comprise a transistor having a gate coupled to the enable input.

3. The single-ended bit line sensor of claim 2 wherein:

the enable input comprises first and second complementary enable inputs; and the first current source comprises a P-channel MOSFET and the second current source comprises an N-channel MOSFET, wherein the gates of the N-channel and P-channel MOSFETs are coupled to respective ones of the first and second complementary enable inputs.

4. The single-ended bit line sensor of claim 1 wherein the pull-down and pull-up devices each comprise an N-channel MOSFET having a gate coupled to the single-ended bit line input.

5. The single-ended bit line sensor of claim 1 wherein the single-ended bit line input has a precharged state and a non-precharged state and wherein the first and second current sources are disabled when the single-ended bit line input is in the precharged state and are enabled when the single-ended bit line input is in the non-precharged state.

6. The single-ended bit line sensor of claim 1 wherein the single-ended bit line input has a precharged state and a non-precharged state and wherein the first and second amplifier inputs have a first voltage swing when the single-ended bit line input is in the precharged state and a second, smaller voltage swing when the single-ended bit line input is in the non-precharged state.

7. The single-ended bit line sensor of claim 1 wherein the single-ended bit line input has a first voltage swing and the first and second amplifier inputs have a second voltage swing which is less than the first voltage swing.

8. A single-ended bit line sensor comprising:

first and second supply terminals;

a single-ended bit line input a sensor output;

a first current source coupled between the first supply terminal and a first voltage output;

a pull-down MOSFET having a drain and source coupled between the first voltage output and the second supply terminal and having a gate coupled to the single-ended bit line input;

a pull-up MOSFET having a drain and source coupled between the first supply terminal and a second voltage output and having a gate coupled to the single-ended bit line input;

a second current source coupled between the second voltage output and the second supply terminal; and a differential amplifier having first and second amplifier inputs coupled to the first and second voltage outputs, respectively, and having an amplifier output coupled to the sensor output.

9. A method of sensing a logic state of a single-ended bit line input having a precharged state, a non-precharged state and a first voltage swing, the method comprising:

receiving the single-ended bit line input;

generating first and second differential voltage levels as a function of the logic state of the single-ended bit line input, the first and second differential voltage levels having a second voltage swing;

reducing the second voltage swing relative to the first voltage swing;

sensing a change in polarity of the first and second differential voltage levels when the single-ended bit line input switches from the precharged state to the non-precharged state; and generating a single-ended output as a function of the sensed change in polarity.

10. The method of claim 9 and further comprising:

precharging the single-ended bit line input to a logic high state;

sensing the polarity of the first and second differential voltage levels when the single-ended bit line input is precharged to the logic high state;

removing precharge from the single-ended bit line input;

reducing the second voltage swing as the precharge is removed; and sensing whether the polarity of the first and second differential voltage levels change after the precharge has been removed and the second voltage swing has been reduced.

11. A single-ended bit line sensor comprising:

a single-ended bit line input having a first voltage swing;

a single-ended sensor output;

means for generating an inverted, level-shifted first output voltage as a function of the single-ended bit line input;

means for generating a noninverted, level-shifted second output voltage as a function of the single-ended bit line input, the first and second output voltages having a second voltage swing relative to one another which is smaller than the first voltage swing; and means for comparing polarity of the first and second output voltages and for generating a sensor output signal on the single-ended sensor output as a function of the comparison.

* * * * *